(12) United States Patent
Sakamoto

(10) Patent No.: US 6,577,993 B1
(45) Date of Patent: Jun. 10, 2003

(54) METHOD OF EXTRACTING PARAMETERS OF DIFFUSION MODEL CAPABLE OF EXTRACTING THE PARAMETERS QUICKLY

(75) Inventor: Hironori Sakamoto, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/386,304

(22) Filed: Aug. 31, 1999

(30) Foreign Application Priority Data

Aug. 31, 1998 (JP) .......................................... 10-245485

(51) Int. Cl.⁷ .............................................. G06F 17/50
(52) U.S. Cl. ............................... 703/14; 703/2; 703/22; 716/4; 702/57
(58) Field of Search ............................... 703/2, 13–22; 716/1–11; 702/57

(56) References Cited

U.S. PATENT DOCUMENTS

| | | | |
|---|---|---|---|
| 5,655,109 A | * | 8/1997 | Hamid .......................... 716/18 |
| 6,330,526 B1 | * | 12/2001 | Yasuda ........................... 703/2 |
| 6,356,861 B1 | * | 3/2002 | Singhal et al. ................ 700/91 |

OTHER PUBLICATIONS

Kondo et al, "Model–Adaptable MOSFET Parameter–Extraction Method Using an Intermediate Model", IEEE Transactions on Computer–Aided Design of Integrated Circuits and Systems, vol. 17 Issue 5, pp. 400–405 (May 1998).*

Zhao et al, "GOPDE: Global Optimization in Small Signal Device Model Parameter Extraction", 1994 IEEE International Symposium on Circuits and Systems, vol. 1, pp. 319–322 (Jun. 1994).*

* cited by examiner

Primary Examiner—Samuel Broda
(74) Attorney, Agent, or Firm—Sughrue Mion, PLLC

(57) ABSTRACT

In a method of extracting parameters of a diffusion model from object parameters to be used in a process simulation of a semiconductor manufacturing process, classifying the object parameters into a first through an N-th (N being a natural integer not smaller than 2) groups, the first group being used for classifying thereinto the most fundamental physical and least model-dependent parameters, the N-th group being used for classifying thereinto the least fundamental physical and most model-dependent parameters, and extracting successively the classified parameters in the first through the N-th groups in the order from the first to the N-th group.

14 Claims, 10 Drawing Sheets

FIG. 2

| PARAMETER | SYMBOL |
| --- | --- |
| Diffusion Constant of $X$ | $D_X$ |
| Intrinsic Diffusion Constant of $X$ | $D_X^{intr}$ |
| Equilibrium Concentration of $X$ | $C_X^*$ |
| Energy Level of Charged $X$ | $e_X$ |
| Barrier-energy of $X/Y$ Reaction | $\Delta E_{X/Y}$ |
| Binding-energy of $XY$ pair | $E_{XY}^{bin}$ |
| Factor of I Mechanism of $X$ | $f_{XI}$ |
| Generation Rate of $X$ | $k_X$ |
| Resolution Rate of $X$ | $k_X/K_X^{eq}$ |
| Surface Recombination Rate of $X$ | $K_X^{srf}$ |
| Absorption Rate of $X$ in Sink Term | $K_X^{sink}$ |

$$k_{X/Y} = 4\pi r \cdot (D_X + D_Y) \cdot \exp(-\Delta E_{X/Y} / k_B T)$$

$$K_{XY}^{eq} = 4/C_{Si} \cdot \exp(E_{XY}^{bin} / k_B T)$$

$$D_{XI} = f_{XI} \cdot D_X^{intr} / C_I^* / K_{XI}^{eq}$$

$$D_{XV} = (1 - f_{XI}) \cdot D_X^{intr} / C_V^* / k_{XV}^{eq}$$

FIG. 6A

MATRIX OF SENSITIVITIES BETWEEN
PROCESS CONDITIONS & PARAMETERS

| PARAMETER | IMPURITY / DOSE | | | | | |
|---|---|---|---|---|---|---|
| | B Lo↔Hi | | P Lo↔Hi | | As Lo↔Hi | |
| | Lo | Hi | Lo | Hi | Lo | Hi |
| $K_I^{sink}$ | × | ○ | × | ◎ | × | ○ |
| $K_I^{srf}$ | ◎ | ○ | ◎ | ○ | ○ | ○ |
| B cluster | × | ○ | — | — | — | — |
| As cluster $E_{AsI}^{bin}$, $E_{AsV}^{bin}$, $f_{AsI}$ | — | — | — | — | × | ◎ |
| | | | | | ○ | ○ |
| $k_{(311)}$, $k_{(311)}^{eq}$ | △ | ○ | ○ | ◎ | × | ○ |
| | ○ | | ○ | ○ | | ○ |

◎, ○, △, × : SENSITIVITY TO PARAMETER

FIG. 6B

EXTRACTING ORDER OF PARAMETERS
WITH PROCESS CONDITIONS

| EX. ORDER | PARAMETER | IMPURITY / DOSE | | | | | | GRAPH |
|---|---|---|---|---|---|---|---|---|
| | | B | | P | | As | | |
| | | Lo ↔ Hi | | Lo ↔ Hi | | Lo ↔ Hi | | |
| 1 | $K_I^{srf}$ | ◯ | | | | | | (1) |
| 2 | $k_{(311)}, K_{(311)}^{eq}$ | | | ◯ | | | | (2) |
| 3 | $K_I^{sink}$ | | | | ◯ | | | (3) |
| 4 | B cluster | ◯◯ | | | | | | (4) |
| 5 | As cluster $E_{AsI}^{bin}, E_{AsV}^{bin}, f_{AsI}$ | | | | | ◯◯ | | (5) |

◯ : PROCESS CONDITION USED FOR EXTRACTION (1) B
40keV, 5x10$^{12}$cm$^{-2}$
implantation
followed by
1125°C 10sec RTA (2) P
40keV, 5x10$^{13}$cm$^{-2}$
implantation
followed by
750°C 10min/60min
anial (3) P
40Kev, $5 \times 10^{14}$ cm$^{-2}$
implantation
followed by
850°C 10min
anneal (4) BF
50Kev, $3 \times 10^{15}$ cm$^{-2}$
implantation
followed by
850°C 10min
anneal

- - - - - as I/I  ○ SIMS B
△ SIMS As  —— Simulation (5) B

B 30KeV 1x10¹³cm⁻² + As 30KeV 3x10¹⁵cm⁻²
implantation followed by
850°C 60min anneal

METHOD OF EXTRACTING PARAMETERS OF DIFFUSION MODEL CAPABLE OF EXTRACTING THE PARAMETERS QUICKLY

BACKGROUND OF THE INVENTION

This invention relates to a method of extracting parameters of a diffusion model for use in a process simulator.

Generally, the process simulator calculates a semiconductor manufacturing process such as an ion implantation process or a diffusion process of impurity by a calculator and predicts a physical amount and a form or the like such as an impurity profile within a semiconductor device.

In a diffusion simulation carried out for simulating the diffusion process in the process simulator, it is very important for improvement of a simulation precision of the process simulator to precisely extract (values of) the parameters of the diffusion model. The parameters are extracted so as to establish measured values in mainly a depth direction of the impurity-profile.

Conventionally, every parameter of the diffusion model is extracted in batch by reducing errors between the parameters and the measured values by the use of a least square method.

Therefore, a conventional method of extracting parameters of a diffusion model has the following disadvantages.

Firstly, it requires a long time for extracting the parameters. This results because every parameter of the diffusion model is extracted in batch by the use of many measured values. Furthermore, when extracting another parameter for another measured value, the conventional method requires newly extracting all the parameters. Therefore, time for extracting the parameters is further increased.

Secondly, the conventional method can not extract such parameters corresponding to the extensive process conditions. This results from the cluster of an applicable scope of the extracted parameters which occurs in the case where the process conditions of the measured values which was used for extracting cluster.

Thirdly, it is difficult to optimize the parameters according to the limited process conditions. This results because sensitivities of the parameters according to the process conditions are unknown, and therefore it is unclear which parameter should be optimized.

Fourthly, the conventional method can not provide such parameters which are applicable and useful to a broad scope. For example, parameters that cannot physically exist are provided. This results because it is essentially impossible for the diffusion model to be completely simulated in physical phenomena and the parameters automatically extracted by the least square method are therefore inaccurate.

SUMMARY OF THE INVENTION

It is an object of this invention to solve the disadvantages mentioned above and to therefore provide a method of extracting parameters of a diffusion model capable of extracting accurate and useful parameters quickly.

Other objectives, features, and advantages of the invention will become apparent from the following description.

This invention is directed to a method of extracting parameters of a diffusion model from object parameters to be used in a process simulation of a semiconductor manufacturing process, the method comprising the steps of classifying the object parameters into a first through an N-th (N being a natural integer not smaller than 2) groups, the first group being used for classifying thereinto the most fundamental physical and least model-dependent parameters, the N-th group being used for classifying thereinto the least fundamental physical and most model-dependent parameters, and extracting successively the classified parameters in the first through the N-th groups in the order from the first to the N-th groups.

This invention is also directed to a method of extracting parameters of a diffusion model from object parameters to be used in a process simulation of a semiconductor manufacturing process, the method comprising the steps of making a matrix which represents an interrelation of sensitivities between process conditions and the object parameters to be extracted, and deciding an extracting order of the parameters and one of the process conditions for use in extracting each of the parameters with the use of the matrix.

This invention is further directed to a method of extracting parameters of a diffusion model from object parameters to be extracted used in a process simulation of a semiconductor manufacturing process, the method comprising the steps of classifying the object parameters into a first through an N-th (the N being a natural integer not smaller than 2) groups, the first group being used for classifying thereinto the most fundamental physical and least model-dependent parameters, the N-th group being used for classifying thereinto the least fundamental physical and most model-dependent parameters, and deciding an extracting order for extracting the classified parameters from each of the first through the N-th groups, making a matrix which represents an interrelation of sensitivities between process conditions and each of the parameters to be extracted, regarding each of the classified parameters to be extracted from each of the first through the N-th groups in the decided extracting order, deciding one of the process conditions for use in extracting each of the parameters with the use of the matrix, and extracting successively the classified parameters in the first through the N-th groups in the order from the first to the N-th group, the parameters extracting step extracts the classified parameters from each of the first through the N-th groups on the basis of the decided extracting order, so that each of the parameters satisfies each of the decided process conditions.

BRIEF DESCRIPTION OF THE DRAWINGS

FIG. 2 is a table chart showing the parameters as the object as the object parameters to be extract by the method according to the embodiment of this invention;

FIGS. 6A and 6B are matrix chart showing the an interrelations between the parameters and the process conditions used in the method according to the embodiment of this invention.

DESCRIPTION OF THE PREFERRED EMBODIMENTS

Now, a preferred embodiment of this invention will be described with reference to the drawings.

A method of extracting parameters of a diffusion model according to an embodiment of this invention is used in a process simulation of a semiconductor manufacturing process. Hereinafter, it is supposed for instance that a computer carries out the method according to a program for carrying out the method recorded in a recording medium.

In FIG. 2, impurities of boron (B), phosphorus (P), or arsenic (As), interstitial silicon (I), or vacancy interstitial silicon (V) is provided into each of inclined symbols X and Y.

Figure 1:
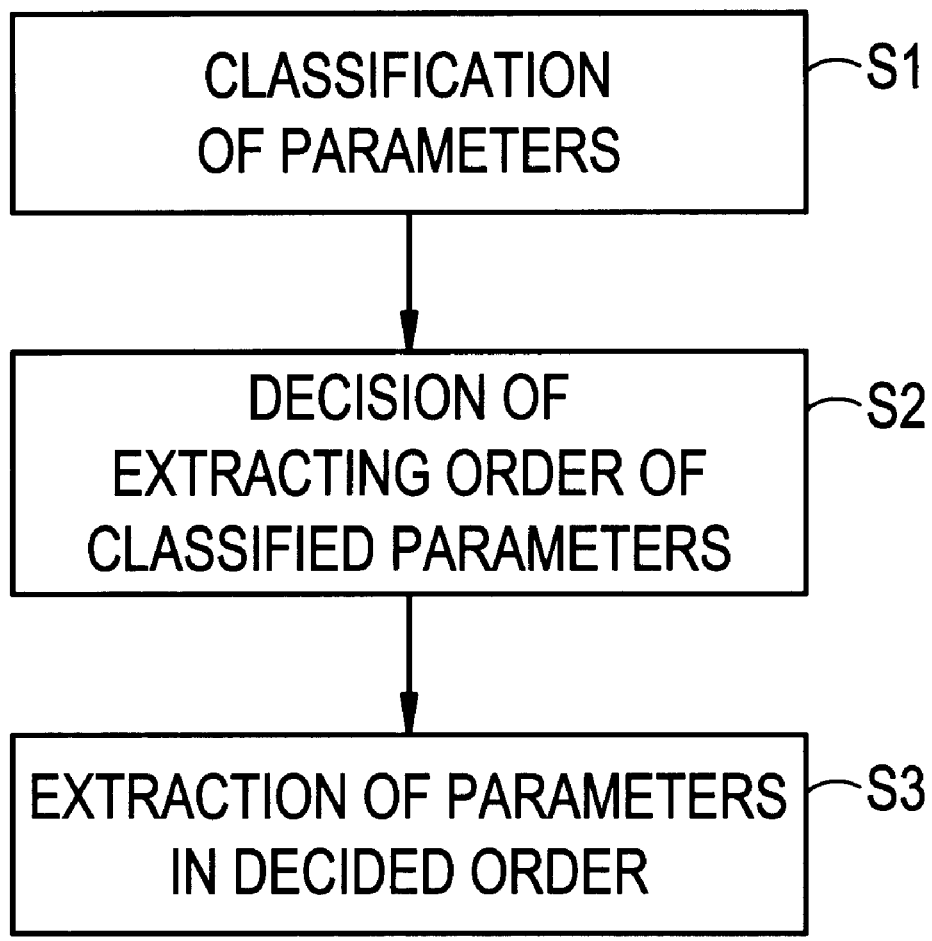
FIG. 1 is a flow chart showing the basic operation of a method of extracting parameters of a diffusion model according to an embodiment of this invention.

Referring to FIG. 1, the computer classifies object parameters to be extracted into a first through a fourth groups (G1 through G4). The first group G1 is used for classifying thereinto the most fundamental physical and least model-dependent parameters. The fourth group G4 is used for classifying thereinto the least fundamental physical and most model-dependent parameters.

Figure 3:
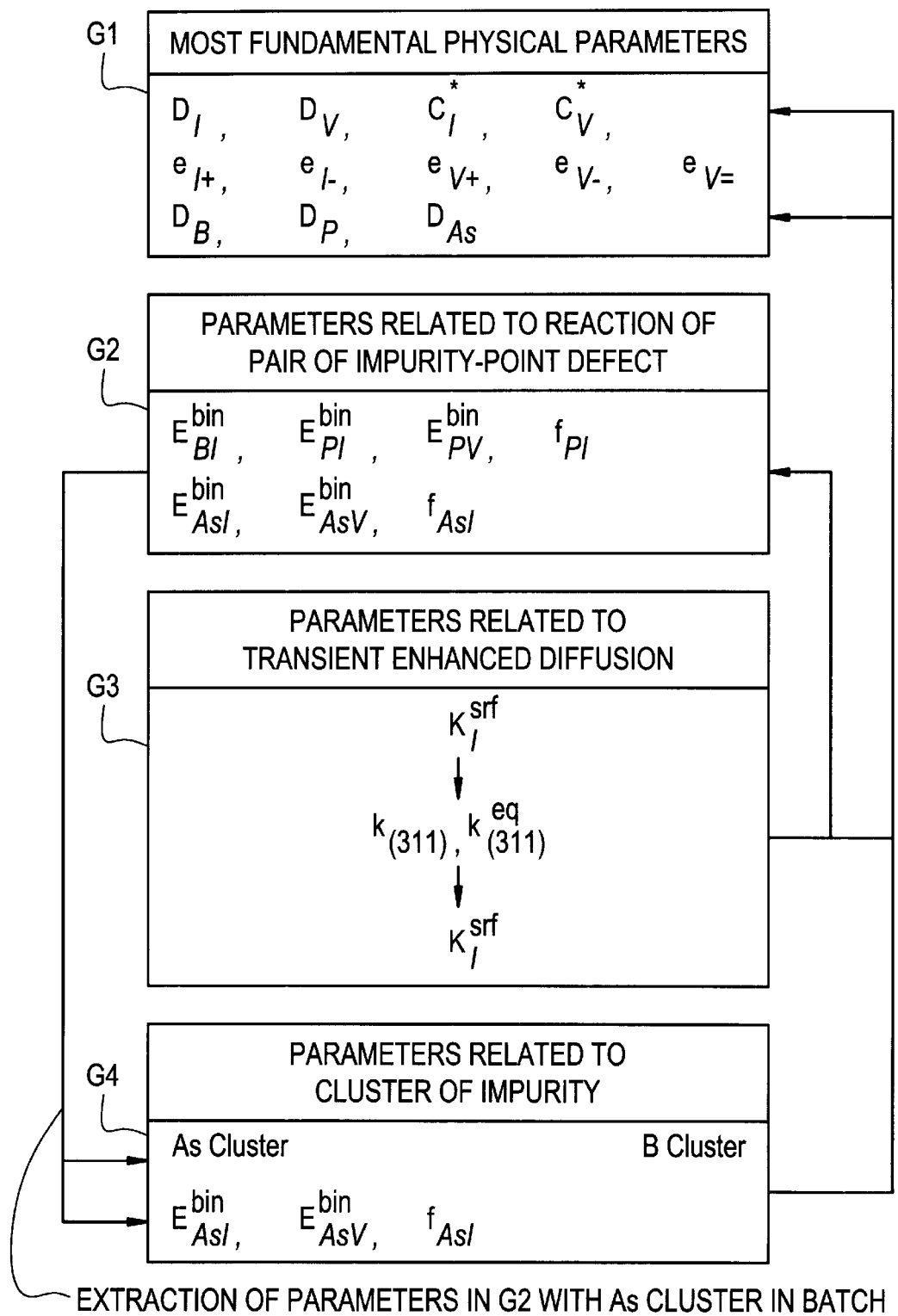
FIG. 3 is a block diagram for use in illustrating group classifying and extracting the parameters as the operation of the method according to the embodiment of this invention.

More concretely, the groups are defined as shown in FIG. 3. The group G1 is used for classifying thereinto the most fundamental physical and the least model-dependency parameters. For instance, the parameters are a DX, an eX, a C*X, and a ΔEX/Y. A group G2 is used for classifying thereinto parameters related to a reaction of a pair of impurity-point defect. For instance, the parameters are an $E^{bin}XY$ and an fX. A group G3 is used for classifying thereinto parameters related to a transient enhanced diffusion. For instance, the parameters are a $K^{srf}X$, a $K^{eq}X$, a $K^{sink}X$, and a kX. The group G4 is used for classifying thereinto parameters related to a cluster of impurity. For instance, the parameters are a generation-resolution constant of an As cluster (As cluster) and a generation-resolution constant of a B (B cluster) although not shown in FIG. 2.

At Step S2 shown in FIG. 1, the computer extracts successively the classified parameters in the groups G1 to G4 in the order from the groups G1 to G4. More specifically, the computer decides an extracting order for extracting the classified parameters from each of the groups G1 to G4. Thus, the computer extracts the classified parameters from each of the groups G1 to G4 in basis on the decided extracting order (Step S3).

Herein, if the computer can not extract an (s+1)-th (s is a natural integer not smaller than 2) parameter on the basis of the decided extracting order, the computer newly extracts the parameters after substituting for an s-th parameter a t-th (t is a natural integer not smaller than 1 but smaller than s) parameter which has been extracted.

Hereinafter, the description about an extracting operation of the method according to the embodiment of this invention will be specifically made.

Figure 4:
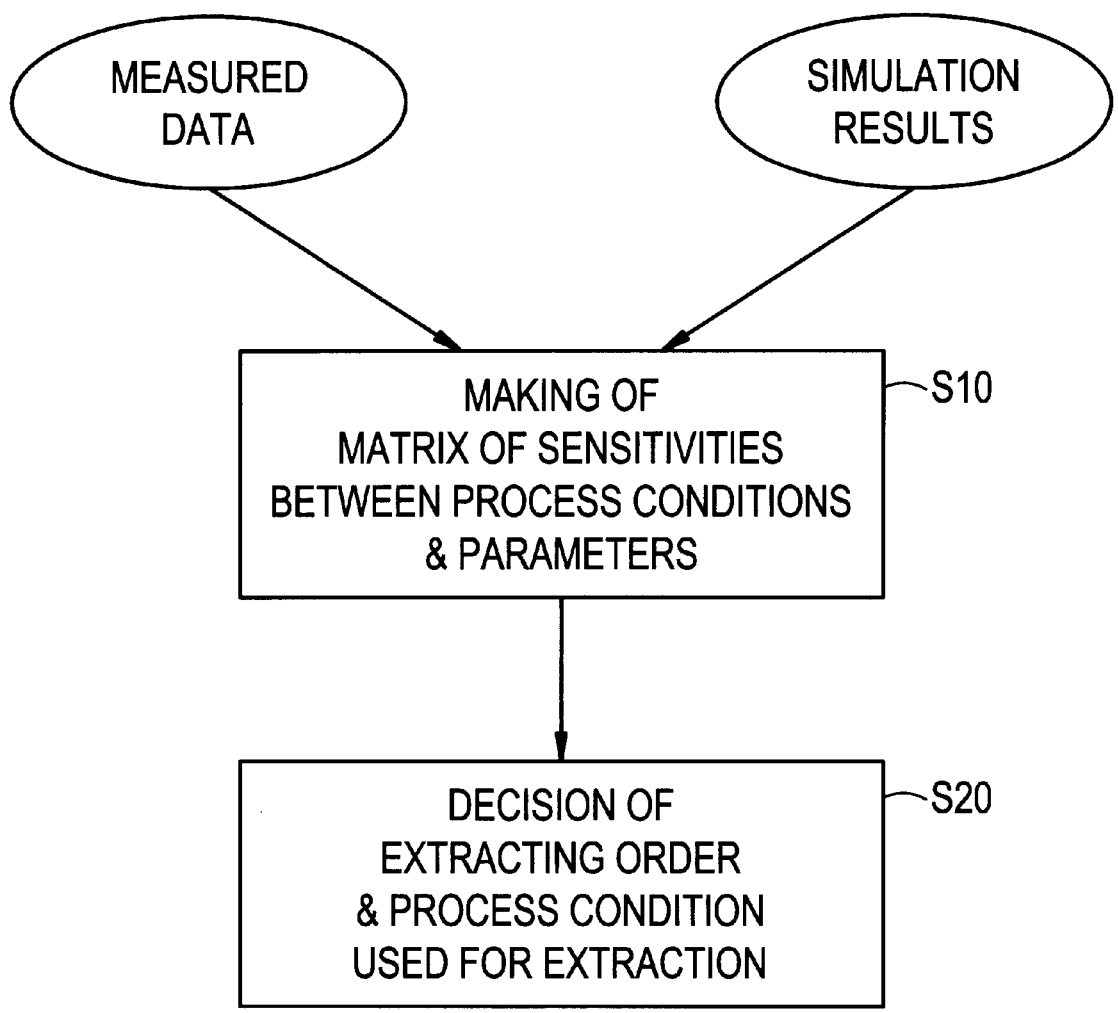
FIG. 4 is a flow chart showing the basic operation of a method of extracting parameters of a diffusion model according to the embodiment of this invention.

Referring to FIG. 4, the computer makes a matrix which represents an interrelation of sensitivities between process conditions and each of the parameters (Step S10). The matrix is made by comparing measured data and simulation results to each other. The measured data are provided by measuring with replacing process conditions such as a kind of ion implanted, implantation dose of ion, and the like. The simulation results are provided by simulating with replacing parameters of the diffusion model regarding each of the process conditions.

The matrix is, for example, made as shown in FIG. 6A and is hereinafter described more specifically.

Thereafter, the computer decides the extracting order of the parameters and one of the process conditions for use in extracting each of the parameters with the use of the made matrix (Step S20).

At Step S20, the extracting order is decided as follows.

Figure 5:
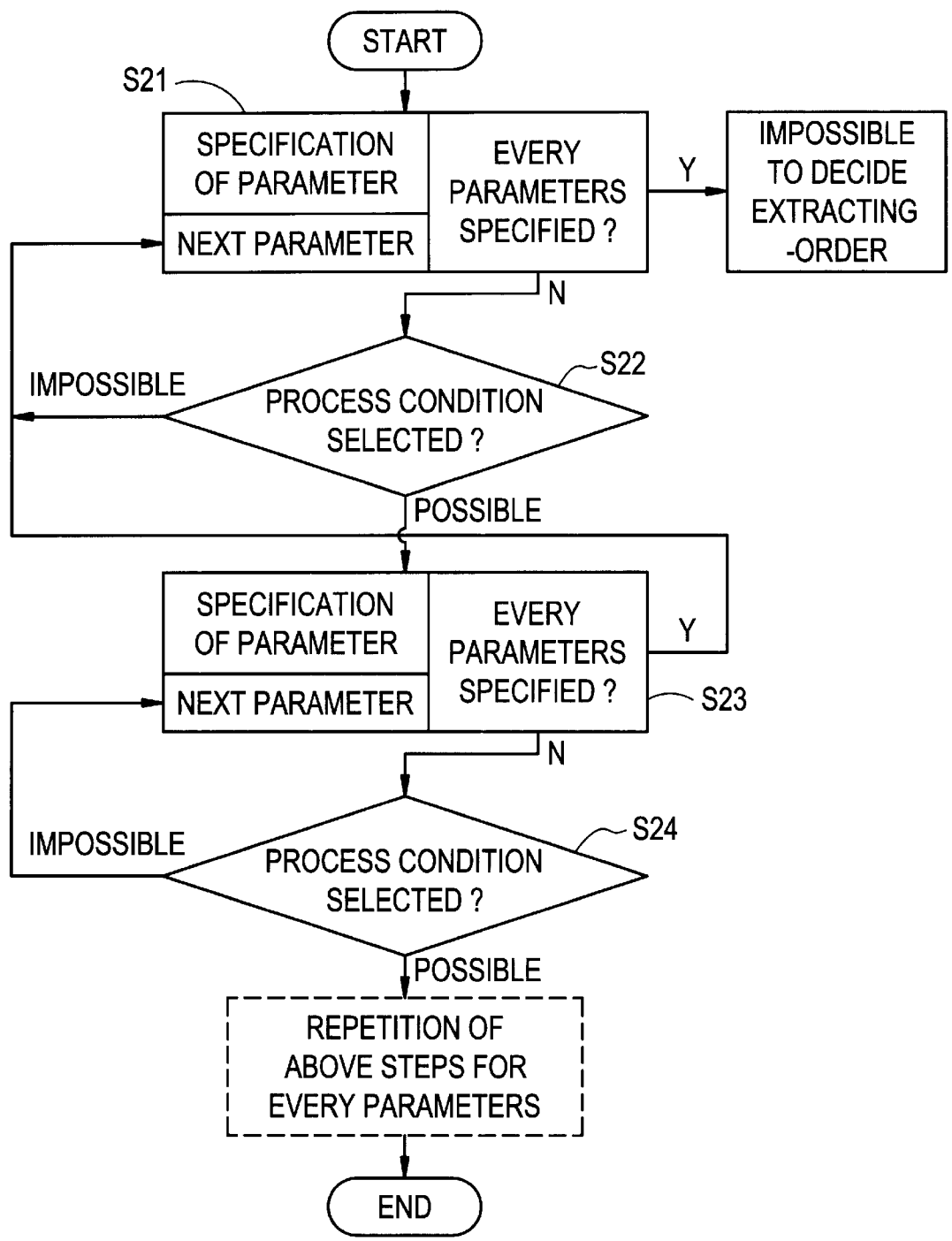
FIG. 5 is a flow chart showing the operation of the method according to the embodiment of this invention.
Figure 7A:
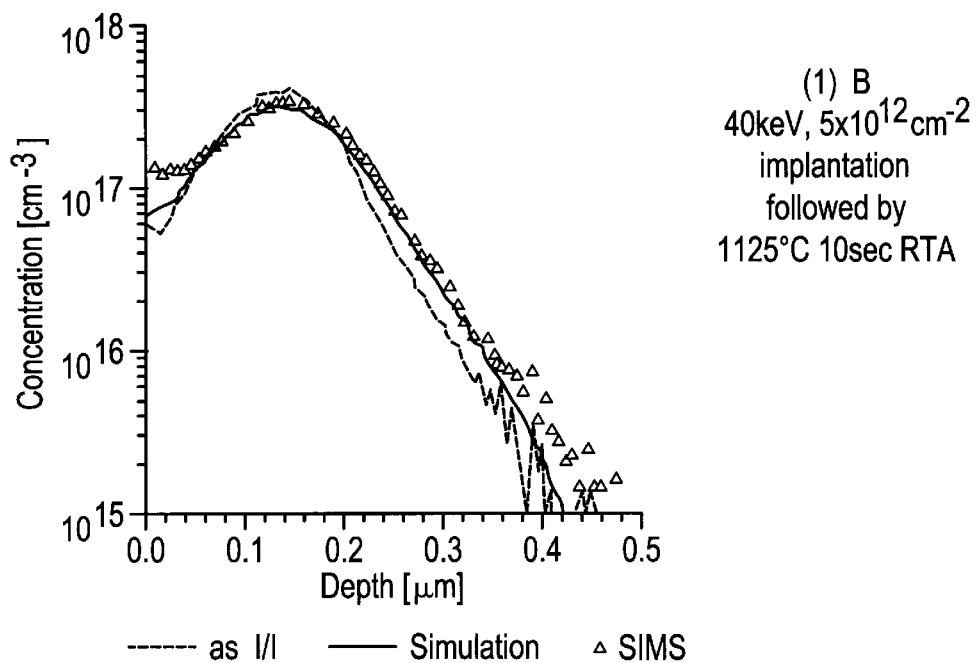
FIGS. 7A, 7B, 8A, 8B, and 9 are line graphs showing the impurity profiles provided by the method according to the embodiment of this invention.
Figure 7B:
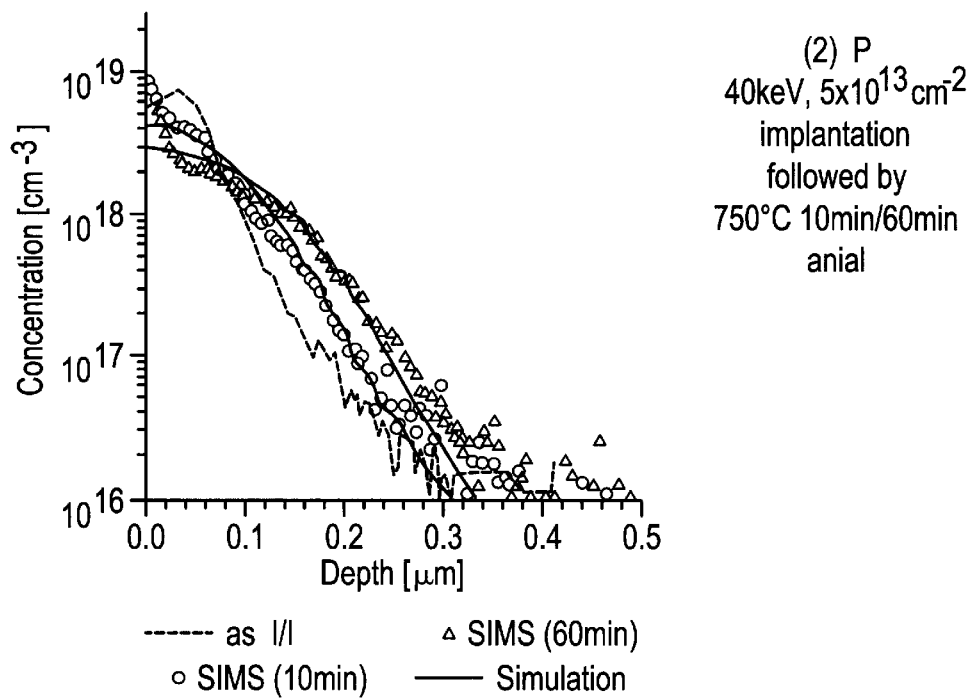
Figure 8A:
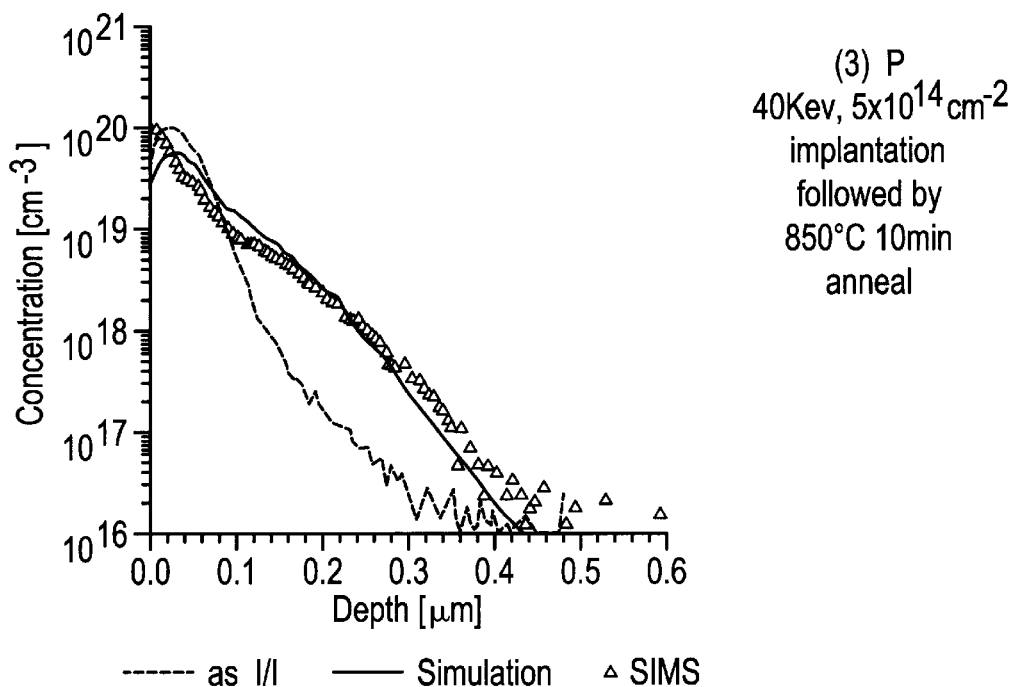
Figure 8B:
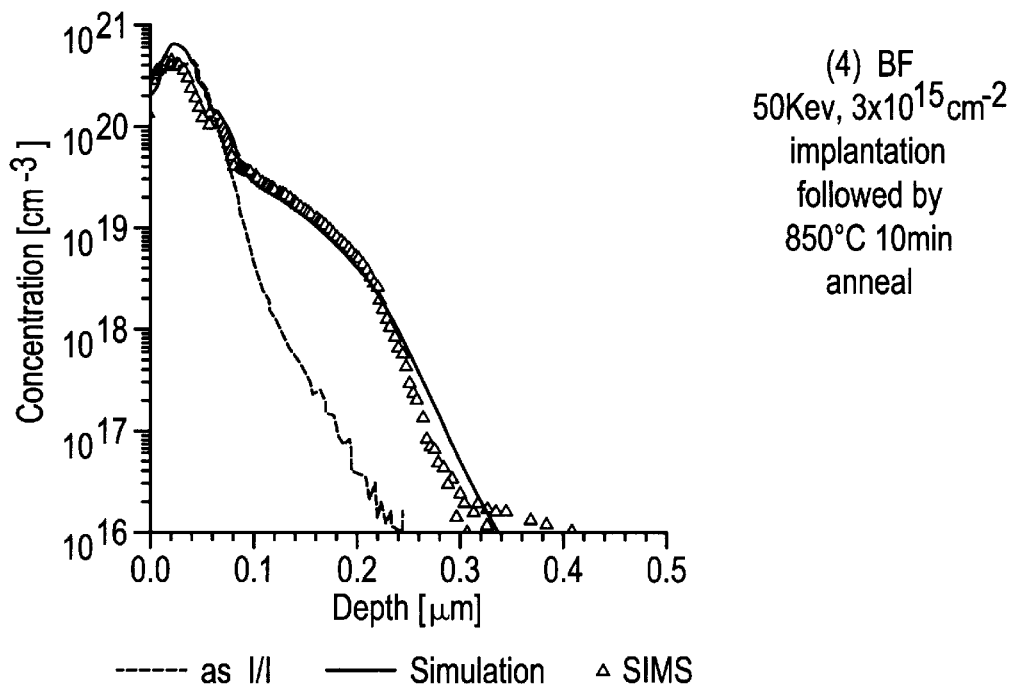
Figure 9:
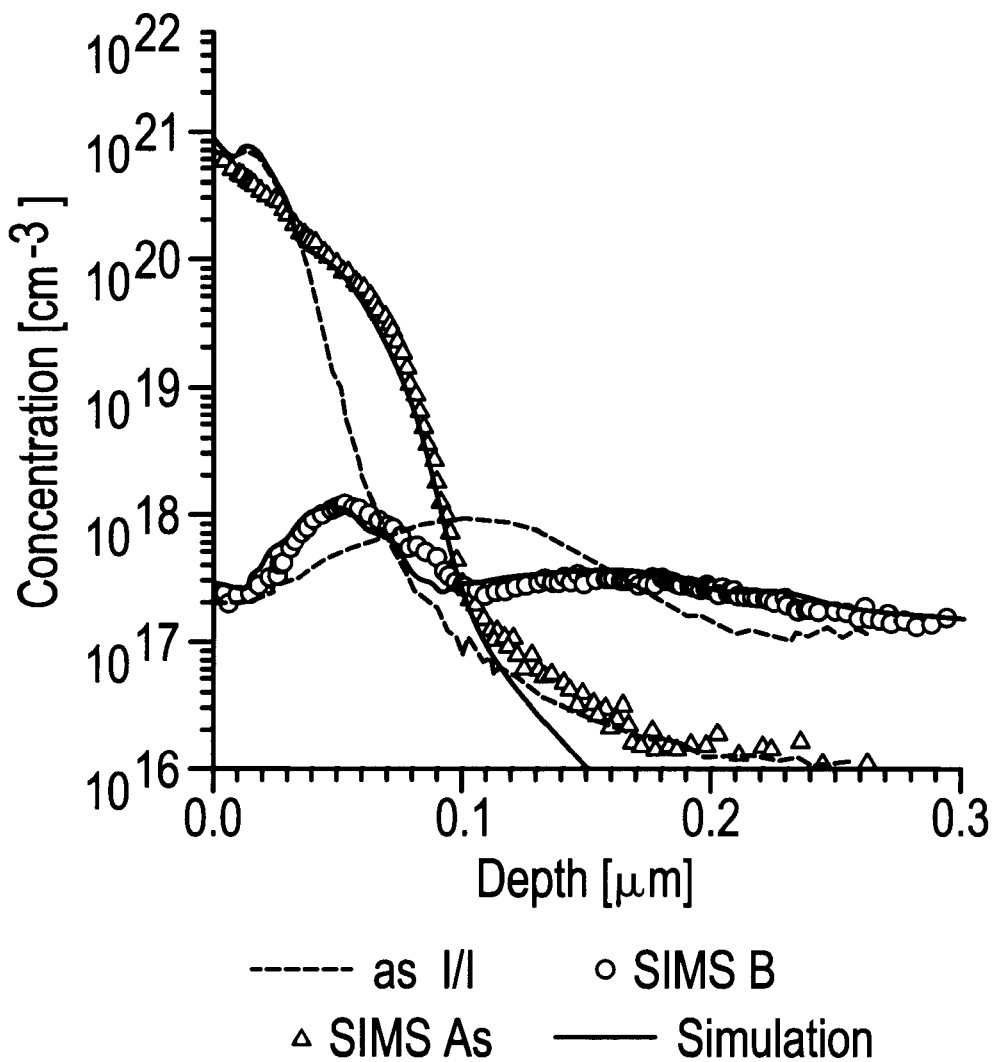

Referring to FIG. 5, the computer specifies, for example, a parameter classified in the group G1 as a parameter to be extracted at first (Step S21).

Thereafter, the computer selects a process condition with comparatively lower sensitivity to parameters except parameters targeted from the process conditions and comparatively higher sensitivity to the parameter specified at Step S21 (Step S22). The computer uses the process condition selected at Step S22 when it firstly extracts the parameter.

If the computer can not select any process condition at Step S22, the computer regards as impossible to extract the targeted parameter and returns to Step S21. Namely, the computer newly decides, as the parameter to be extracted at first, a parameter classified in the group G1 different from the parameter decided at Step S21.

Next, the computer specifies a parameter to be extracted secondly so as to select from remaining parameters except the parameter specified at Step S21 in the group G1 (Step S23).

At Step S24, the computer selects a process condition in the manner similar to that of Step S22. Thus, the computer uses the process condition selected at Step S24 when extracting the second parameter. If the computer can not select any process condition at Step S24, the computer returns to Step 23. Namely, the computer newly decides, as the parameter to be extracted secondly, a parameter classified in the group G1 different from the parameter decided at Step S23. On the other hand, if the computer can not decide any parameters as the parameter to be extracted secondly, the computer returns to Step S21, newly decides the parameter to be extracted firstly, and newly carries out the steps after Step S21. Thereafter, the computer selects parameters to be extracted thirdly and thereafter and decides the process conditions and the extracting order.

Referring to FIG. 6A, the matrix made at Step S10 represents an interrelation of sensitivities between high, medium, and low doses of each of impurities B, P, and As as process conditions and each of a $K^{sink}I$, a $K^{srf}X$, the B cluster, the As cluster, an $E^{bin}AsI$, an $E^{bin}AsV$, an fAsI, a k(311), and a $k^{eq}$(311) as the parameters serving as object parameters to be extract. In FIG. 6A, marks ⊙, ○, Δ, and × represent in turn that sensitivity is high to low gradually.

Therefore, the computer extracts the parameters each of the groups G2, G3, and G4 in turn after extracting the fundamental physical parameters from the group G1. Herein, the computer extracts the parameters according to the extracting process shown in FIG. 4 with making at Step S10 the matrix shown in FIG. 6A and applying to Step S10 the extracting process shown in FIG. 5.

In the embodiment, it is supposed that the computer extracts the parameters classified in the group G2 with the generation-resolution constant of the As cluster (the As cluster) classified in the group G4 in batch and that the parameters classified in the group G2 are therefore extracted after the extraction from the group G3, as apparent from FIG. 3.

Now, the computer specifies the parameter $K^{srf}_I$, classified in the group G3, as the parameter to be extracted firstly and selects a process with low sensitivity to the remaining parameters except the specified parameter $K^{srf}_I$ and from low dose of B and low-medium dose of P as the process conditions with high sensitivity to the parameter $K^{srf}_I$ by referring to the matrix shown in FIG. 6A. For example, the computer selects the process conditions without the mark ⊙ marked on the remaining parameters except $K^{srf}_I$: the low dose of B and the low dose of P. Thus, the process conditions: the low dose of B and the low dose of P are used for extracting the specified parameter $K^{srf}_I$. However, if the computer cannot select any process condition, the computer regards as impossible the extraction of the specified parameter $K^{srf}_I$, newly specifies another parameter classified in the group G3 or the other groups as the parameter to be extracted firstly, returns to Step S21, and newly processes from Step S21 and thereafter.

Next, the computer specifies, as the parameters to be extracted secondly and thirdly from the group G3, parameters which do not affect the process conditions: the low dose of B and the low dose of P. Namely, the computer specifies the parameters $k_{(311)}$ and $k^{eq}_{(311)}$. Furthermore, the computer selects medium dose of P as the process condition. Herein, if the computer cannot select any process condition for the next parameter, the computer newly specifies other parameters classified in the group G3 or the other groups as the parameters to be extracted secondly and thirdly.

The computer could however select the process condition and extract the parameter at this time, the computer specifies another parameter $K^{sink}_I$ to be extracted fourthly, selects process condition for the $K^{sink}_I$: high dose of P, and extracts the $K^{sink}_I$. If the computer cannot select any process condition for the next parameter, the computer newly specifies other parameters classified in the group G3 or the other groups as the parameters to be extracted fourthly.

Lastly, the computer specifies as parameters the B cluster and the As cluster classified in the group G4 and the parameters classified in the group G2 and reserved to extract: $E^{bin}_{AsI}$, $E^{bin}_{AsV}$, and $f_{AsI}$, selects process condition for each of the B cluster, the As cluster, the $E^{bin}_{AsI}$, the $E^{bin}_{AsV}$, and the $f_{AsI}$ parameters: high dose of B or high dose of As, and extracts the B cluster, the As cluster, the $E^{bin}_{AsI}$, the $E^{bin}_{AsV}$, and the $f_{AsI}$ parameters. Also, if the computer cannot select any process condition for each of the parameters, the computer newly specifies another parameter classified in the present or past group, returns to Step S21, and newly processes at and after Step S21.

The process in the method according to the embodiment of this invention described above advances as directed by arrows shown in FIG. 3. Furthermore, the extracting order, decided by the process, of the parameters classified in the groups and process conditions used for extracting each of the parameters are as shown in FIG. 6B. Thus, profiles of impurity shown in FIGS. 7A, 7B, 8A, 8B, and 9 are in consequence simulated with the use of the extracting order and the process conditions shown in FIG. 6B.

As described above, the method of extracting parameters of a diffusion model according to the embodiment of this invention can quickly extract the parameters because the parameters are classified into individual and peculiar groups and therefore the parameter later extracted does not affect the one extracted before it so that it is unnecessary to newly extract frequently. Furthermore, comparatively more fundamental physical parameters are extracted because the fundamental physical parameters which are not affected by more model-dependent parameters can be extracted. Moreover, it is efficient to newly extract partially when extracting another new parameters because it is possible to reuse the fundamental physical parameters which have been extracted.

Furthermore, the method according to the embodiment of this invention can extract the parameters capable of dealing with the various process conditions because measured data are correctly limited so that precision of the simulation is high. Moreover, the method according to the embodiment of this invention can easily optimize the parameters to the process conditions because such parameter as to be optimized just to the process condition is distinctly selected.

While this invention has thus far been described in conjunction with the embodiment thereof, it will readily be possible to put this invention into practice in various other manners. For example, although a primary invention claimed in Claim 1 and a secondary invention claimed in Claim 5 are combined with each other in the embodiment, the primary and the secondary inventions are carried out separately from each other.

What is claimed is:

1. A method of extracting parameters of a diffusion model from object parameters to be used in a process simulation of a semiconductor manufacturing process, said method comprising the steps of:

classifying said object parameters into a first through an N-th (N being a natural integer not smaller than 2) groups, said first group being used for classifying thereinto the most fundamental physical and the least model-dependent parameters, said N-th group being used for classifying thereinto the least fundamental physical and the most model-dependent parameters; and extracting successively the parameters classified into said first through said N-th groups in the order from said first to said N-th group.

2. A method as claimed in claim 1, wherein said first through said N-th groups comprise:

a first group for classifying thereinto the most fundamental physical and the least model-dependency parameters;

a second group for classifying there into parameters related to a reaction of a pair of impurity-point defect;

a third group for classifying thereinto parameters related to a transient enhanced diffusion; and a fourth group, which serves as said N-th group, for classifying thereinto parameters related to a cluster of impurity.

3. A method as claimed in claim 1, further comprising the step of deciding an extracting order for extracting the classified parameters from each of said first through said N-th groups; and wherein the parameters extracting step extracts the classified parameters from each of said first through said N-th groups in the decided extracting order.

4. A method as claimed in claim 3, further comprising the step of, when the parameters extracting step can not extract an (s+1)-th (s being a natural integer not smaller than 2) parameter based on the decided extracting order, newly extracting the parameters after substituting for an s-th parameter a t-th (t being a natural integer not smaller than 1 but smaller than s) parameter which has been extracted.

5. A method of extracting parameters of a diffusion model from object parameters to be used in a process simulation of a semiconductor manufacturing process, said method comprising the steps of:

making a matrix which represents an interrelation of sensitivities between process conditions and said parameters to be extracted;

deciding an extracting order of the parameters and one of the process conditions for use in extracting each of the parameters with the use of the matrix; and extracting the parameters in the decided extracting order.

6. A method of extracting parameters of a diffusion model from object parameters to be used in a process simulation of a semiconductor manufacturing process, said method comprising the steps of:

classifying said object parameters into a first through an N-th (N being a natural integer not smaller than 2) group, said first group being used for classifying thereinto the most fundamental physical and least model-dependent parameters, said N-th group being used for classifying there into the least fundamental physical and most model-dependent parameters;

deciding an extracting order for extracting the classified parameters from each of said first through said N-th group;

making a matrix which represents an interrelation of sensitivities between process conditions and each of said parameters to be extracted;

regarding each of the classified parameters to be extracted from each of said first through said N-th groups on the basis of the decided extracting order, deciding one of the process conditions for use in extracting each of the parameters with the use of the made matrix; and extracting successively the parameters classified into said first through said N-th groups in the order from said first to said N-th group, the parameters extracting step extracts the classified parameters from each of said first through said N-th groups on the basis of the decided extracting order, so that each of the parameters satisfies each of the decided process conditions.

7. A method as claimed in claim 6, further comprising the step of, when the process conditions deciding step can not decide a process condition for an (x+1)-th (x being a natural integer) parameter to be extracted on the basis of the decided extracting order, newly deciding the extracting order after substituting for an x-th parameter a y-th (y being a natural integer not smaller than x) parameter.

8. A recording medium for use in a program carrying out a method of extracting parameters of a diffusion model from object parameters to be used in a process simulation of a semiconductor manufacturing process, said method comprising the steps of:

classifying said object parameters into a first through an N-th (N being a natural integer not smaller than 2) groups, said first group being used for classifying thereinto the most fundamental physical and least model-dependent parameters, said N-th group being used for classifying thereinto the least fundamental physical and most model-dependent parameters; and extracting successively the parameters classified into said first through said N-th groups in the order from said first to said N-th group.

9. A recording medium as claimed in claim 8, wherein said first through said N-th groups include:

a first group for classifying thereinto the most fundamental physical and the least model-dependency parameters;

a second group for classifying thereinto parameters related to a reaction of a pair of impurity-point defect;

a third group for classifying thereinto parameters related to a transient enhanced diffusion; and a fourth group, which serves as said N-th group, for classifying thereinto parameters related to a cluster of impurity.

10. A recording medium as claimed in claim 8, further comprising the step of deciding an extracting order for extracting the classified parameters from each of said first through said N-th group; and the parameters extracting step extracts the classified parameters from each of said first through said N-th groups in the decided extracting order.

11. A recording medium as claimed in claim 10, further comprising the step of, when the parameters extracting step can not extract an (s+1)-th (s being a natural integer not smaller than 2) parameter in basis on the decided extracting order, newly extracting the parameters after substituting for an s-th parameter a t-th (t being a natural integer not smaller than 1 but smaller than s) parameter which has been extracted.

12. A recording medium for use in a program carrying out a method of extracting parameters of a diffusion model from object parameters to be used in a process simulation of a semiconductor manufacturing process, said method comprising the steps of:

making a matrix which represents an interrelation of sensitivities between process conditions and said parameters to be extracted;

deciding an extracting order of the parameters and one of the process conditions for use in extracting each of the parameters with the use of the matrix; and extracting the parameters in the decided extracting order.

13. A recording medium for use in a program carrying out a method of extracting parameters of a diffusion model from object parameters to be used in a process simulation of a semiconductor manufacturing process, said method comprising the steps of:

classifying said object parameters into a first through an N-th (N being a natural integer not smaller than 2) groups, said first group being used for classifying thereinto the most fundamental physical and least model-dependent parameters, said N-th group being used for classifying thereinto the least fundamental physical and most model-dependent parameters;

deciding an extracting order for extracting the classified parameters from each of said first through said N-th group;

making a matrix which represents an interrelation of sensitivities between process conditions and each of said parameters to be extracted;

regarding each of the classified parameters to be extracted from each of said first through said N-th groups on the basis of the decided extracting order, deciding one of the process conditions for use in extracting each of the parameters with the use of the made matrix; and extracting successively the parameters classified into said first through said N-th groups in the order from said first to said N-th group, the parameters extracting step extracts the classified parameters from each of said first through said N-th groups on the basis of the decided extracting order, so that each of the parameters satisfies each of the decided process conditions.

14. A recording medium as claimed in claim 13, further comprising the step of, when the process conditions deciding step can not decide a process condition for an (x+1)-th (x being a natural integer) parameter to be extracted on the basis of the decided extracting order, newly deciding the extracting order after substituting for an x-th parameter a y-th (y being a natural integer not smaller than x) parameter.

* * * * *